US010354845B2

(12) United States Patent
Poenitzsch et al.

(10) Patent No.: US 10,354,845 B2
(45) Date of Patent: Jul. 16, 2019

(54) ATMOSPHERIC PRESSURE PULSED ARC PLASMA SOURCE AND METHODS OF COATING THEREWITH

(71) Applicant: Southwest Research Institute, San Antonio, TX (US)

(72) Inventors: Vasiliki Zorbas Poenitzsch, Alamo Heights, TX (US); Ronghua Wei, San Antonio, TX (US); Edward Langa, San Antonio, TX (US); Kent E. Coulter, Boerne, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 15/046,600

(22) Filed: Feb. 18, 2016

(65) Prior Publication Data
US 2017/0243727 A1    Aug. 24, 2017

(51) Int. Cl.
*H01J 37/32* (2006.01)
*C23C 4/134* (2016.01)
*B05B 7/22* (2006.01)
*C23C 4/08* (2016.01)
(Continued)

(52) U.S. Cl.
CPC ........ *H01J 37/32825* (2013.01); *B05B 7/224* (2013.01); *C23C 4/08* (2013.01); *C23C 4/134* (2016.01); *H01J 37/32055* (2013.01); *H01J 37/3255* (2013.01); *H01J 37/32449* (2013.01); *H01J 37/32513* (2013.01); *H01J 37/32605* (2013.01); *H01J 37/32614* (2013.01);
(Continued)

(58) Field of Classification Search
CPC ......... H01J 37/32577–32614; H01J 37/32055; H01J 37/32064; H01J 37/32825; H01J 37/3244; H01J 37/32449
USPC .............. 427/447, 449, 456, 562, 563, 564; 219/121.47, 121.5, 121.51, 121.52
See application file for complete search history.

(56) References Cited

U.S. PATENT DOCUMENTS 3,376,211 A * 4/1968 Bjornson ................. C07C 2/80
422/186.03
3,644,782 A * 2/1972 Sheer ...................... H01J 37/32
219/121.51
(Continued)

OTHER PUBLICATIONS

Kouznetsov, V., et a; "A Novel Pulsed Magnetron Sputter Technique Utilizing Very High Target Power Densities," Surface and Coatings Technology, vol. 122 (1999), pp. 290-293.
(Continued)

*Primary Examiner* — Marianne L Padgett
(74) *Attorney, Agent, or Firm* — Grossman, Tucker el al.

(57) ABSTRACT

An atmospheric pressure pulsed arc plasma source and method of using including a housing having a housing opening therein; an insulator tube having an insulator tube opening therein, retained within the housing opening; and a conductive tube, retained within the insulator tube opening. A nozzle is retained by the housing. A feed path is defined in the conductive tube and the nozzle and a gas feed port is operatively coupled to the feed path. Feedstock is provided in the feed path and electrically coupled to the conductive tube. A pulsed DC power source provides a pulsed voltage to the conductive tube. The plasma source emits a discharge stream having a temperature that is less than 50° C. from the nozzle and a coating is formed on a substrate.

10 Claims, 9 Drawing Sheets

(51) Int. Cl.
*H05H 1/34* (2006.01)
*H05H 1/42* (2006.01)

(52) U.S. Cl.
CPC ............... *H05H 1/34* (2013.01); *H05H 1/42* (2013.01); *H05H 2001/3447* (2013.01)

(56) References Cited

U.S. PATENT DOCUMENTS

| | | | | |
|---|---|---|---|---|
| 3,649,805 | A * | 3/1972 | Rohrberg | B22D 23/10 219/121.45 |
| 4,048,465 | A * | 9/1977 | Manz | B23K 9/013 219/121.52 |
| 4,055,741 | A * | 10/1977 | Bykhovsky | B23K 10/00 219/121.36 |
| 5,248,371 | A | 9/1993 | Maher et al. | |
| 5,874,134 | A * | 2/1999 | Rao | B01J 19/088 118/302 |
| 6,124,563 | A * | 9/2000 | Witherspoon | C23C 4/12 219/121.47 |
| 6,274,837 | B1 * | 8/2001 | Windischmann | C23C 16/276 219/69.17 |
| 6,287,642 | B1 * | 9/2001 | Leutsch | C23C 14/027 204/192.12 |
| 6,472,632 | B1 * | 10/2002 | Peterson | B01J 19/088 219/121.43 |
| 6,706,993 | B1 * | 3/2004 | Chancey | B05B 7/224 219/121.47 |
| 7,147,759 | B2 | 12/2006 | Chistyakov | |
| 8,277,617 | B2 | 10/2012 | Chiang et al. | |
| 8,328,982 | B1 | 12/2012 | Babayan et al. | |
| 8,496,992 | B2 | 7/2013 | Wei et al. | |
| 8,629,371 | B2 * | 1/2014 | Oberste-Berghaus | C23C 4/06 219/121.47 |
| 8,866,038 | B2 * | 10/2014 | Lindsay | H05H 1/34 219/121.48 |
| 2001/0006093 | A1 | 7/2001 | Tabuchi et al. | |
| 2002/0053557 | A1 * | 5/2002 | Peterson | B01J 19/088 219/121.43 |
| 2002/0129902 | A1 | 9/2002 | Babayan et al. | |
| 2003/0230554 | A1 * | 12/2003 | Schroder | B01J 19/088 219/121.59 |
| 2004/0060813 | A1 | 4/2004 | Chistyakov | |
| 2004/0173583 | A1 * | 9/2004 | Iriyama | H05H 1/26 219/121.53 |
| 2005/0106435 | A1 * | 5/2005 | Jang | H01M 4/881 429/483 |
| 2008/0139003 | A1 | 6/2008 | Pirzada et al. | |
| 2008/0145553 | A1 * | 6/2008 | Boulos | B01J 19/088 427/447 |
| 2011/0220490 | A1 | 9/2011 | Wei et al. | |
| 2013/0264317 | A1 * | 10/2013 | Hoffa | B23K 10/006 219/121.53 |
| 2014/0041805 | A1 | 2/2014 | Kuga et al. | |
| 2014/0154415 | A1 | 6/2014 | Tomyo et al. | |
| 2014/0186540 | A1 * | 7/2014 | Schramm | B05B 7/22 427/449 |
| 2016/0165713 | A1 | 6/2016 | Yuzurihara et al. | |
| 2016/0329193 | A1 | 11/2016 | Sieber et al. | |
| 2017/0142819 | A1 | 5/2017 | Poenitzsch et al. | |
| 2017/0175253 | A1 | 6/2017 | Chistyakov et al. | |
| 2018/0240656 | A1 * | 8/2018 | Gorokhovsky | H01J 37/3452 |

OTHER PUBLICATIONS

Lin, J., et al; "Ion Energy and Mass Distributions of the Plasma During Modulated Pulse Power Magnetron Sputtering", Surface Coatings Technology, vol. 203 (2009) pp. 3676-3685.
Schutze, A., et al; "The Atmospheric-Pressure Plasma Jet:: A Review and Comparison to Other Plasma Sources". IEEE Transactions on Plasma Science, vol. 26, No. 6, Dec. 1998, pp. 1685-1694.
Atmospheric-Pressure Plasma <<https://en.wikipedia.org/wiki/Atmospheric-pressure_plasma>> (accessed Nov. 18, 2015).
U.S. Office Action dated Feb. 23, 2017 issued in related U.S. Appl. No. 14/944,017 (14 pgs).
U.S. Office Action dated Sep. 27, 2017 issued in related U.S. Appl. No. 14/944,017 (15 pgs).
U.S. Office Action dated Jun. 22, 2018 issued in U.S. Appl. No. 14/944,017 (16 pgs).

* cited by examiner

ATMOSPHERIC PRESSURE PULSED ARC PLASMA SOURCE AND METHODS OF COATING THEREWITH

GOVERNMENT SUPPORT CLAUSE

This invention was made with United States Government support under Contract No. HR0011-13-C-0008 from the Defense Advanced Research Projects Agency. The Government has certain rights in this invention.

FIELD

The present disclosure is directed to an atmospheric pressure pulsed arc plasma source (APPAPS) and methods of depositing metallic or ceramic coatings using the APPAPS.

BACKGROUND

Metallic or ceramic coatings are commonly deposited using a vacuum process such as physical vapor deposition (PVD) or plasma assisted chemical vapor process (PACVD). In either case, a vacuum chamber is used to generate plasma at low gas pressures, typically from a few millitorr to a few hundred torr. In these conditions, the plasma may be generated relatively easily. Coatings may then be deposited on parts positioned within the vacuum chamber by introducing the components of the coating within the chamber. Although the coating quality of the vacuum-based process is quite high, having to perform the process inside a vacuum chamber system is relatively cumbersome. For some applications, vacuum deposition in a chamber is nearly impossible when treating large structures, such as an aircraft wing or the impeller of a ship, or portions thereof. An atmospheric pressure (AP) plasma deposition process, which does not require a chamber to regulate atmospheric pressure and allows processing of relatively large components, becomes attractive and practical.

One such atmospheric pressure plasma deposition process includes plasma spray. In simplistic form, the plasma spray system includes an insulated housing, a cathode positioned within the housing, an anode surrounding a portion of the cathode providing a nozzle, an arc gas feed, a powder and carrier gas feed, and electrical and water connections. The plasma spray system is operated in relatively high power DC mode of a few hundred kilowatts to ignite the arc gas and achieve a flame temperature in the range of 6,650° C. to 11,000° C. so that metallic powder used in the coating may be melted and deposited on a substrate. In the process the metallic powder is propelled at speeds of 240 to 550 m/s. In embodiments, the cathode is formed of tungsten and the anode of copper, the arc gas includes argon or nitrogen, and the carrier gas may include hydrogen. The housing, anode, and, optionally, the cathode may be water cooled. Overheating of substrates being coated is minimized by rotating or cooling samples or moving samples quickly away from the plasma source. Due to the high power DC operation mode, the resultant coating is relatively thick, typically in the range of 0.1 to 5 mm, and generally porous.

Thermal spray processes, such as high velocity oxygen fuel spray, may also be used to deposit coatings, even though the process does not utilize plasma, the process utilizes relatively high operating temperatures in the range of 3000° C. Lower temperature processes, such as cold spray processes that operate at about 900° C., accelerate relatively fine particles of less than 20 micrometers. However, deposition efficiency is relatively low.

Accordingly, room remains for the improvement of plasma coating systems. Systems that form coatings at lower process temperatures and provide coatings that exhibit relatively low porosity are particularly desirable.

SUMMARY

An aspect of the present disclosure relates to an atmospheric pressure pulsed arc plasma source. The atmospheric pressure pulsed arc plasma source includes a housing, including a housing opening therein. An insulator tube having an insulator tube opening therein is retained within the housing opening and a conductive tube is retained within the insulator tube opening, wherein the conductive tube includes a first portion and a second portion. The atmospheric pressure pulsed arc plasma source also includes a nozzle retained by the housing and positioned around a first portion of the conductive tube, a feed path defined in the conductive tube and the nozzle, and a gas feed port operatively coupled to the feed path. A pulsed DC power supply is electrically coupled to the conductive tube wherein the pulsed DC power supply is configured to provide a pulsed voltage in the range of 0.5 to 100 kV at a pulse frequency in the range of 10 to 5000 Hz and a pulse width of 1 to 5000 µs. The atmospheric pressure pulsed arc plasma source emits a discharge stream having a temperature that is less than 50° C. as measured by a thermocouple placed into the discharge stream one centimeter from the nozzle.

Another aspect of the present disclosure relates to a method of treating a surface with the system set forth above. The method includes providing an atmospheric pressure pulsed arc plasma source, including a housing, including a housing opening therein; an insulator tube having an insulator tube opening therein, wherein the insulator tube is retained within the housing opening; a conductive tube retained within the insulator tube opening, wherein the conductive tube includes a first portion and a second portion; a nozzle retained by the housing and positioned around a first portion of the conductive tube; a feed path defined in the conductive tube and the nozzle; a gas feed port operatively coupled to the feed path; and a pulsed DC power supply electrically coupled to the conductive tube and the nozzle. The method further includes supplying a gas to the gas feed port from a gas supply and feeding a consumable feed stock through the feed path. A pulsed voltage to is supplied to the conductive tube from a pulsed DC power supply in the range of 0.5 to 100 kV relative to the nozzle at a pulse frequency in the range of 10 to 5000 Hz and a pulse width of 1 to 5000 µs. Plasma is formed with the gas in the nozzle and a discharge stream is emitted from the nozzle onto a substrate, wherein the discharge stream comprises the plasma and exhibits a temperature of less than 50° C. as measured by a thermocouple placed into the discharge stream 1 cm from the nozzle. Further, the consumable feed stock is vaporized and the discharge stream includes the vapor. The vapor is deposited onto the substrate to form a coating.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

The present disclosure is directed to an atmospheric pressure pulsed arc plasma source (APPAPS). The present disclosure is also directed to methods of treating substrate surfaces by depositing metallic or ceramic coatings on substrate surfaces. Depending on the feed stock and gasses used during deposition, the coatings may be metallic or ceramic.

Figure 1:
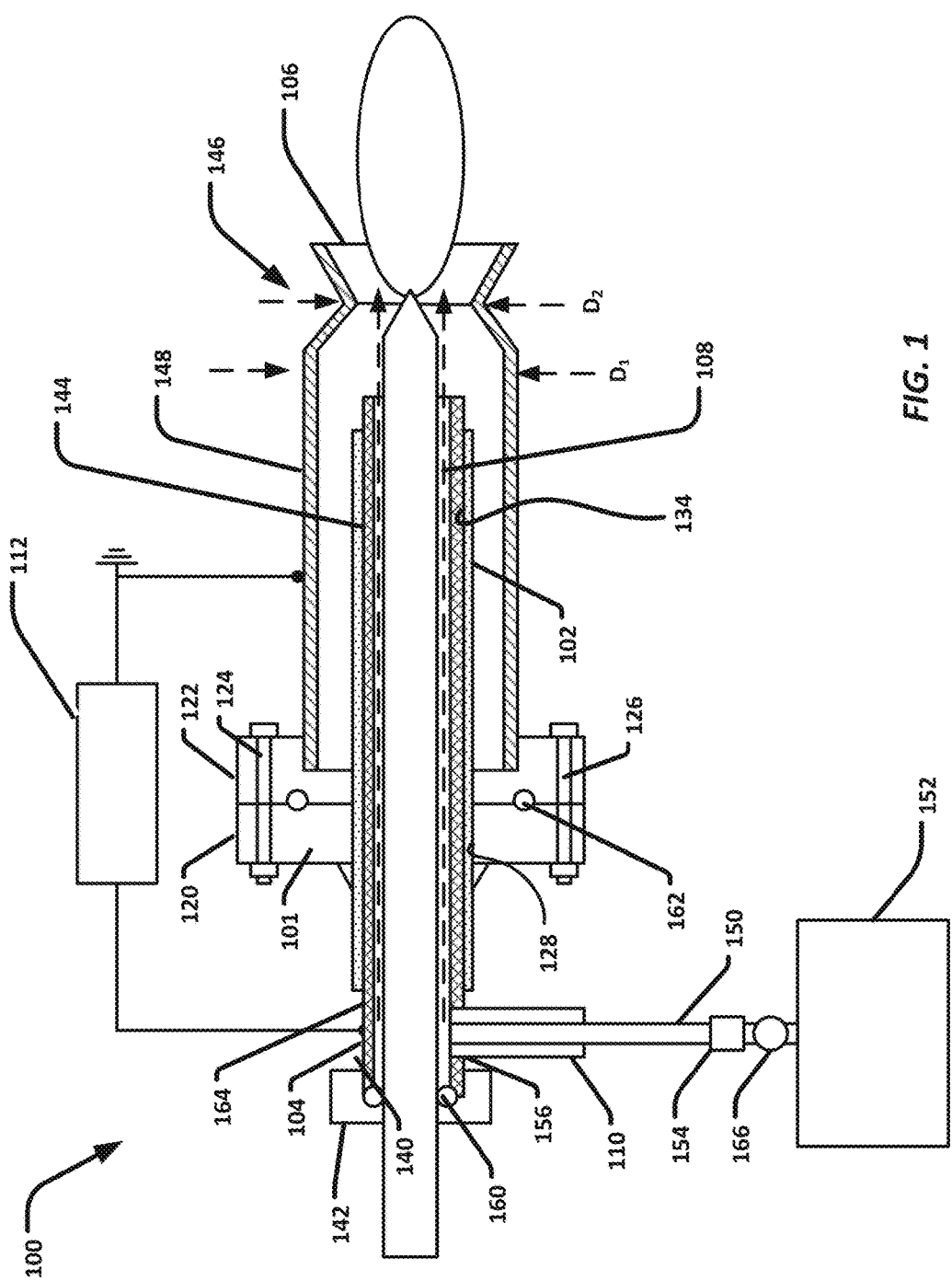
FIG. 1 illustrates a schematic of an embodiment of an atmospheric pressure pulsed arc plasma source described herein.
Figure 2:
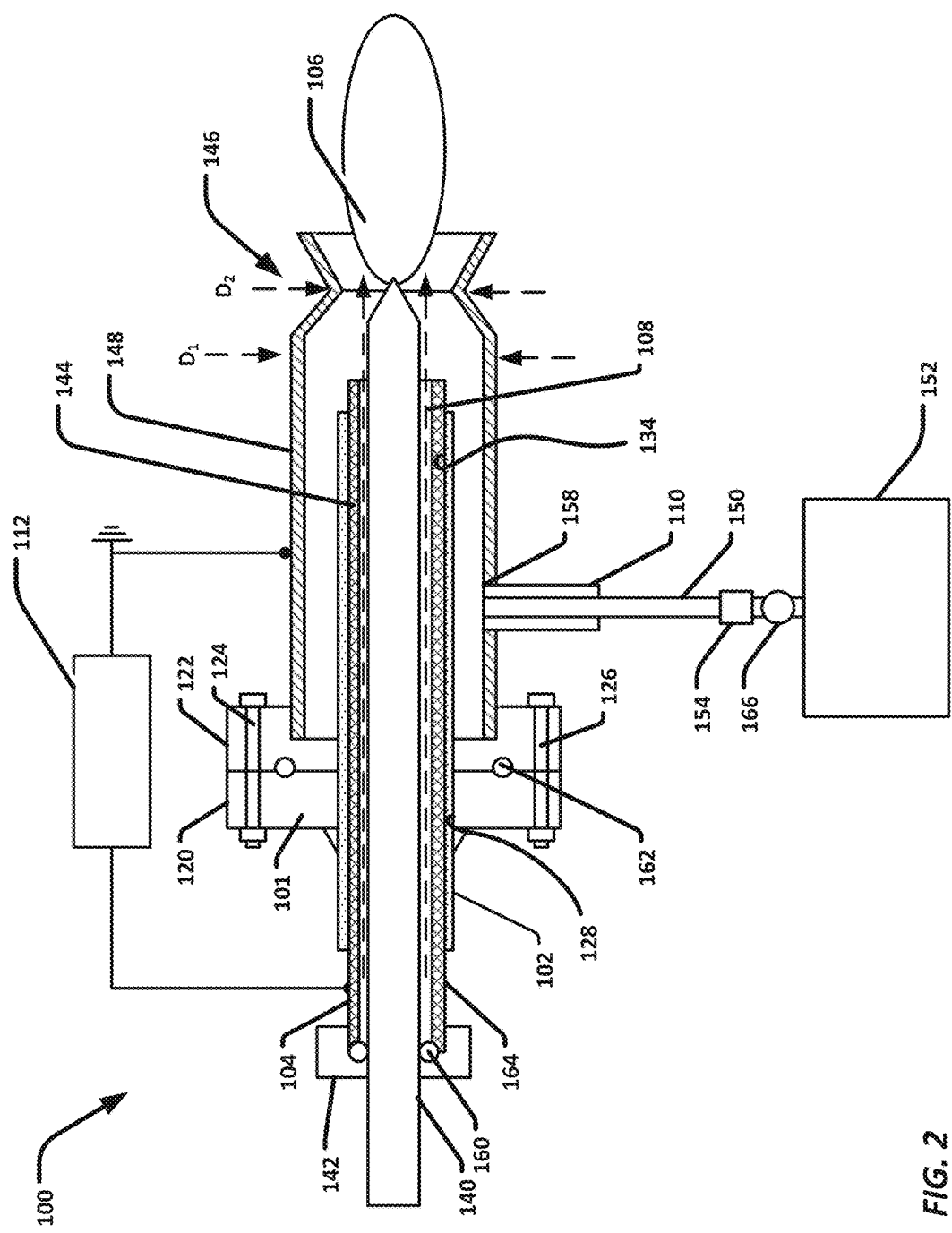
FIG. 2 illustrates a schematic of another embodiment of an atmospheric pressure pulsed arc plasma source described herein.

Embodiments of the atmospheric pressure pulsed arc plasma source are illustrated in FIGS. 1 and 2. Generally, the atmospheric pressure pulsed arc plasma source 100 includes a housing 101, an insulator tube 102 retained in the housing, a conductive tube 104 held by the insulator tube 102, a nozzle 106, wherein a portion of the conductive tube is positioned within and preferably terminates within the nozzle 106, a feed path 108 defined in the conductive tube and the nozzle, a gas feed port 110 operatively coupled to the feed path 108, and a pulsed DC power supply 112 electrically coupled to the conductive tube 104 and the nozzle 106.

As illustrated, the housing 101 includes two halves 120, 122 that are secured together using mechanical fasteners 124, 126 such as bolts or screws. The housing may alternatively be formed from a single unitary piece or more than the two pieces illustrated, such as three pieces, four pieces, etc. The provision of the second half 122 allows for interchangeability of the nozzle 106, which in this embodiment is mounted to the housing 101. The housing 101 also includes a housing opening 128 therein, which retains the insulator tube 102. As illustrated, the housing opening 128 is defined by a bore hole that extends through the housing and passes through both halves 120, 122 of the housing 101. However, the opening need not extend all the way through the housing 101, but in embodiments may terminate in the housing.

In other embodiments the housing opening 128 may be defined by the housing halves 120, 122, which close upon the insulator tube 102 and conductive tube 104 similar to a clamshell and an insulated spacer may be used to position the nozzle relative to the insulator tube 102 and conductive tube 104. In such arrangement, one portion of the opening is defined by the surface of one housing half and the other portion of the opening is defined by the surface of the other half of the housing.

In preferred embodiments, the first opening has a circular cross-section. Alternatively, the opening may be oblong, rectangular, square or other configurations and may be selected depending on, for example, the shape of the feed stock. The housing may be formed of an insulating material, such as a ceramic or glass.

As noted above, an insulator tube 102 is retained within the housing opening 128 in the housing 101. The insulator tube 102 has an insulator tube opening 134 therein to accommodate the conductive tube 104. The cross-section of the insulator tube 102 is preferably similar to that of the housing opening 128 in the housing and is circular in shape. However, as alluded to above, the insulator tube opening 134 may be oblong, rectangular, square or other configurations and may be selected depending on, for example, the shape of the feed stock. The insulator tube 102 may be formed from a ceramic material, such as or fluorphlogopite mica in a borocilicate glass matrix, available from Corning under the tradename MACOR. Preferably, the material exhibits an electrical resistivity of $10^{13}$ ohm-cm or greater, such as in the range of $10^{13}$ ohm-cm to $10^{17}$ ohm-cm, including all values and ranges therein, at a temperature in the range of 20° C.-22° C. In embodiments, the insulator tube 102 is secured in the housing through an interference fit, by a mechanical fastener such as mating threads provided on the insulator tube 102 and the housing 101, or by the use of an adhesive or cement.

A conductive tube 104 is retained within the opening of the insulator tube 134. As illustrated, the conductive tube 104 extends out from either end of the insulator tube 104. Alternatively, the conductive tube 104 may extend the length of the insulator tube 104, or may be shorter than the insulator tube 104. The conductive tube is formed of a metal or metal alloy that preferably exhibits an electrical resistivity of $10 \times 10^{-8}$ Ohm*m or less, such as in the range of $1 \times 10^{-8}$ Ohm*m to $10 \times 10^{-8}$ Ohm*m, wherein the electrical resistivity is measured at a temperature in the range of 20° C. to 22° C. In addition, the metal or metal alloy preferably exhibits a melting point (the temperature at which the vapor pressure of the solid and the liquid are the same and the pressure totals one atmosphere) of 1000° C. or greater, including all values and ranges from 1000° C. to 3800° C. The conductive tube 104 includes a feed path 108 formed therein.

In embodiments, a consumable feed stock 140 is fed through the feed path 108 by a feeder 142. The feed stock 140 is preferably in the form of a wire, having a length of greater than 15 inches; however, welding sticks having a length of 15 inches or less may be employed as well. The feed stock 140 provides an electrode and comprises a metallic material, i.e., a metal or metal alloy, selected from transition metals, lanthanides, alkaline earth metals and metalloids. Exemplary metallic materials include iron, chromium, copper, aluminum, manganese, magnesium, nickel, niobium, yttrium, tungsten, silicon and boron. The feed stock 140 may also comprise nonmetals including carbon, nitrogen, oxygen, sulfur, and phosphorous. In particularly preferred embodiments, the feed stock comprises stainless steel or copper. The feed stock preferably exhibits a circular cross-section. Alternatively, the feed stock may exhibit other geometries and may be rectangular, square, or oblong.

In preferred embodiments, the feed path 108 exhibits a cross-sectional geometry that conforms to the geometry of the cross-section of the feed stock 140. In other embodiments, the cross-sectional geometry of the feed path 108 need not be conformal. Clearance between the conductive tube 104 and the feed stock 140 is preferably in the range of 0.1 mm to 4.0 mm, including all values and ranges therein.

The atmospheric pressure pulsed arc plasma source also includes nozzle 106 retained by housing 101 and positioned around a first portion 144 of the conductive tube 104. In preferred embodiments, the conductive tube 104 extends into and terminates within the nozzle 106. The nozzle 106 forms a portion of the feed path 108. The nozzle is preferably formed from the same material as the electrode. In one example, both the nozzle and the electrode, feed stock may be formed from copper. Alternatively, the nozzle and feed stock may be formed from different materials and, preferably, the nozzle is formed of a material that compliments or improves the properties of the feed stock material. For example, a molybdenum nozzle may be used to improve corrosion resistance of a stainless steel feed stock. The nozzle 106 may comprise a metallic material, i.e., a metal or metal alloy, selected from transition metals, lanthanides, alkaline earth metals and metalloids. Again, exemplary metallic materials include iron, chromium, copper, aluminum, manganese, magnesium, nickel, niobium, yttrium, tungsten, silicon and boron. The nozzle 106 may also comprise nonmetals including carbon, nitrogen, oxygen, sulfur, and phosphorous.

The nozzle 106 preferably includes a constricted portion 146. The diameter of the constricted portion $D_2$ is reduced to a minimum diameter that is less that the diameter $D_1$ of the first portion 148 of the nozzle 106 in which the conductive tube 104 is received. Preferably, the conductive tube extends into and terminates within the first portion 148 of the nozzle 106. However, in other embodiments, the conductive tube 104 terminates in the constricted portion of the nozzle 146. The diameter size of the constricted portion $D_2$ may be at least 25% of the diameter of $D_1$, including all values and ranges, such as from 25% to 75% of the diameter $D_1$, preferably 25% to 50% of the diameter of $D_1$ and more preferably 25% to 40% of the diameter $D_1$.

A gas feed port 110 is operatively coupled to the feed path 108, such that process or carrier gasses may flow from the feed port 110 into and through the feed path 108. The gas sweeps around the feed stock 140, between the feed stock 140. Alternatively or additionally, the gas sweeps around the conductive tube 104 and through the nozzle or between the conductive tube 104 and the nozzle. The gas feed port 110 is coupled to a gas supply line 150 that may be fed from one or more storage tanks 152. One or more flow control valves 154 and pressure regulators 166 may be provided in the gas supply line 150 to regulate the flow rate of the gas or the pressure of the gas delivered to the feed path 108. As illustrated in FIG. 1, the feed port 110 is connected to feed path 108 through an opening 156 in the conductive tube 104 and, if necessary, the insulator tube 102. As illustrated in FIG. 2, the feed port 110 is coupled to the nozzle 106 and gasses flow from the gas line 150 through the feed port 110 and into the nozzle 106 through an opening in the nozzle 158. The feed port 110 optionally extends through the openings 156, 158 into the feed path 108. In either embodiment of FIG. 1 or FIG. 2 one or more sealing rings 160, 162 may be provided to prevent gasses from flowing out of the portion 164 of the conductive tube 104 opposing the nozzle.

In embodiments, the gas is preferably argon, nitrogen, a carbon containing gas such as acetylene, air or combinations thereof. The gas is preferably delivered at a pressure, measured at a pressure regulator 166 provided in the gas supply line 150, in the range of 5 kPa to 700 kPa, including all values and ranges therein.

A pulsed DC power supply 112 is electrically coupled to the conductive tube 104, which is electrically coupled to the feed stock 140. In addition, the pulsed DC power supply 112 is also electrically coupled to the nozzle 106 and ground as illustrated in FIGS. 1 and 2. The pulsed DC power supply 112 is configured to provide a negative pulsed voltage in the range of 0.5 kV to 100 kV to the conductive tube 104 relative to the nozzle 106 at a pulse frequency in the range of 10 Hz to 5000 Hz and a pulse width of 1 µs to 5000 µs. In preferred embodiments, the voltage is in the range of 500 V to 2000 V, the pulse frequency is in the range of 500 Hz to 2000 Hz, and the pulse width is in the range of 10 µs to 200 µs. The current provided by the DC power supply is in the range of 1 A to 1,000 A, including all values and ranges therein, and the power is in the range of 1 kW to 1,000 kW, including all values and ranges therein. In preferred embodiments, the current is in the range of 5 A to 200 A and the power is in the range of 5 kW to 200 kW. Electrical coupling is facilitated using conductive wires, which for example, connect the power supply outputs to the electrodes and ground as illustrated. During operation, due to the pulsed DC power, the atmospheric pressure pulsed arc plasma source emits a discharge stream having a temperature that is less than 50° C. as measured by a thermocouple placed into the discharge stream 1 cm from the nozzle, such as in the range of 10° C. to 50° C., and preferably from 10° C. to 30° C.

Figure 3:
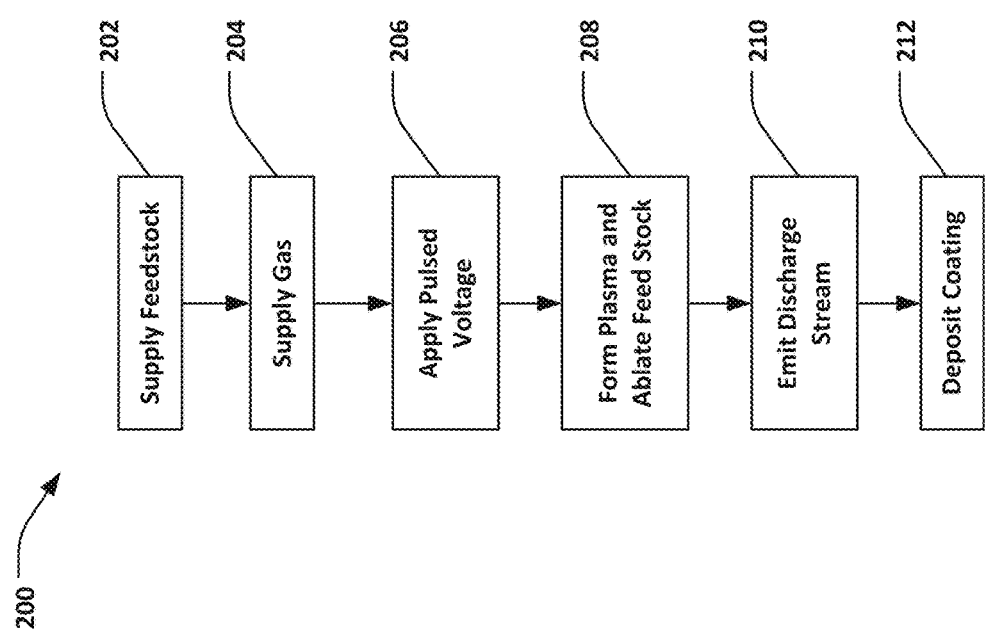
FIG. 3 illustrates a flow chart of an embodiment of a method of treating surface using the atmospheric pressure pulse arc plasma source.

Another aspect of the present disclosure relates to a method for treating a substrate surface using the atmospheric pressure pulsed arc plasma source described herein and is illustrated in FIG. 3. Substrates include a variety of materials such as polymeric materials, natural fibers, metallic materials, ceramic materials and combinations thereof. Polymeric materials include, for example, polycarbonate, high-density polyethylene, low-density polyethylene, polypropylene and nylon. Natural fibers include, for example, cellulose fibers. Metallic materials, i.e., a metal or metal alloy, are selected from transition metals, lanthanides, alkaline earth metals and metalloids. Again, exemplary metallic materials include iron, chromium, copper, aluminum, manganese, magnesium, nickel, niobium, yttrium, tungsten, silicon and boron. Ceramic materials include metallic materials along with nonmetals including, for example, carbon, nitrogen, oxygen, sulfur, and phosphorous.

In an embodiment of the method 200, a feed stock is supplied to the feed path in the conductive tube 202 and gas is supplied to the feed path from the gas supply 204. As noted above, the gas is preferably argon, nitrogen, a carbon containing gas such as acetylene, air or combinations thereof. The gas is also preferably delivered at a pressure, measured at a pressure regulator provided in the gas supply line 150, in the range of 5 kPa to 700 kPa, including all values and ranges therein. The gas travels through the feed port into the feed path through either the conductive tube or the nozzle. In embodiments, the feed stock includes a metal and the gas includes carbon or nitrogen to form metal carbide or metal nitride, wherein the metal is preferably a transition metal. In preferred embodiments, argon and nitrogen gas or argon and carbon containing gas (such as acetylene) are used in combination with titanium to form TiN or TiC, respectively. In further embodiments, a metal, such as a transition metal, may be employed with argon and both nitrogen containing and carbon containing gasses to form a metal carbo-nitride. In alternative embodiments, the gas includes argon and both the nozzle and consumable feed stock include, or consists of, the same material.

A pulsed voltage is applied to the feedstock through the conductive tube from a pulsed DC power supply in the range of 0.5 to 100 kV relative to the nozzle, which is preferably grounded, 206. Again, the pulsed voltage is applied at a pulse frequency in the range of 10 to 5000 Hz and a pulse width of 1 to 5000 µs. In preferred embodiments, the voltage is in the range of 500 to 2000 V, the pulse frequency is in the range of 500 to 2000 Hz, the pulse width is in the range of 10 to 200 µs. The current provided by the DC power supply is in the range of 1 A to 1,000 A, including all values and ranges therein, and the power is in the range of 1 kW to 1,000 kW, including all values and ranges therein. In preferred embodiments, the current is in the range of 5 to 200 Amps and the power is in the range of 5 to 200 kW.

At least a portion of the gas, charged by the arc voltage, then ignites to form plasma in the nozzle and a discharge stream is emitted from the nozzle onto a substrate 208 comprising the plasma. In preferred embodiments, the plasma is expelled from the nozzle due to the arc current and self-induced magnetic field. The discharge stream exhibits a temperature of less than 50° C. as measured by a thermocouple placed into said discharge stream 1 cm from the nozzle. In addition, the feed stock and material from the nozzle are ablated, i.e., vaporized. Particles of the ablated materials from the feed stock and nozzle entrained in the plasma discharge stream 210. The particles are then deposited onto the substrate surface forming a coating thereon 212.

EXAMPLES

Coating Formation

Two coatings were formed using the atmospheric pressure pulsed arc plasma source described in FIG. 1 above. A 340 stainless steel coating and a copper coating were formed on silicon wafer substrates. The process parameters for forming the coatings are set forth in Table 1 below.

TABLE 1

| | | | Process Conditions | | | |
|---|---|---|---|---|---|---|
| Coating | Electrode Material | Nozzle Material | Argon Gas Pressure (psi) | Power Supply Voltage (kV) | Power Pulse Frequency (Hz) | Power Pulse Width (µs) |
| Stainless Steel | 340 Stainless Steel | Molybdenum | 20 | 1.15 | 500 | 20 |
| Copper | Copper | Copper | 52 | 1.2 | 500 | 20 |

A 340 stainless steel wire was used to form a stainless steel coating commonly used for corrosion protection. A molybdenum nozzle was selected as it is understood that molybdenum may provide further corrosion protection to the stainless steel. The copper coating was selected as copper coatings are useful in welding aluminum.

Figure 4A:
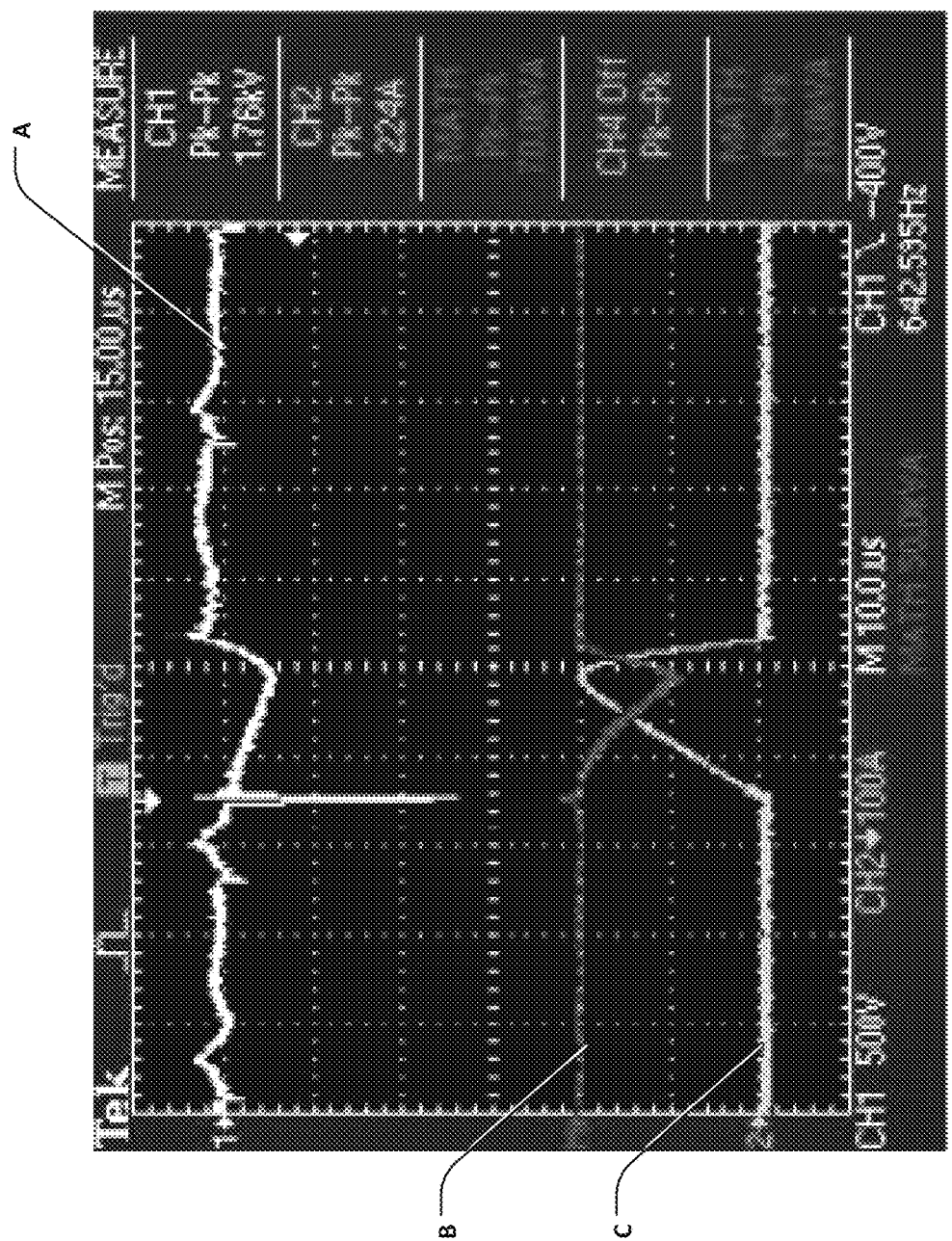
FIG. 4a illustrates a screenshot of oscilloscope traces of voltage, current and power during the operation of an atmospheric pressure pulsed arc plasma source as described herein.
Figure 4B:
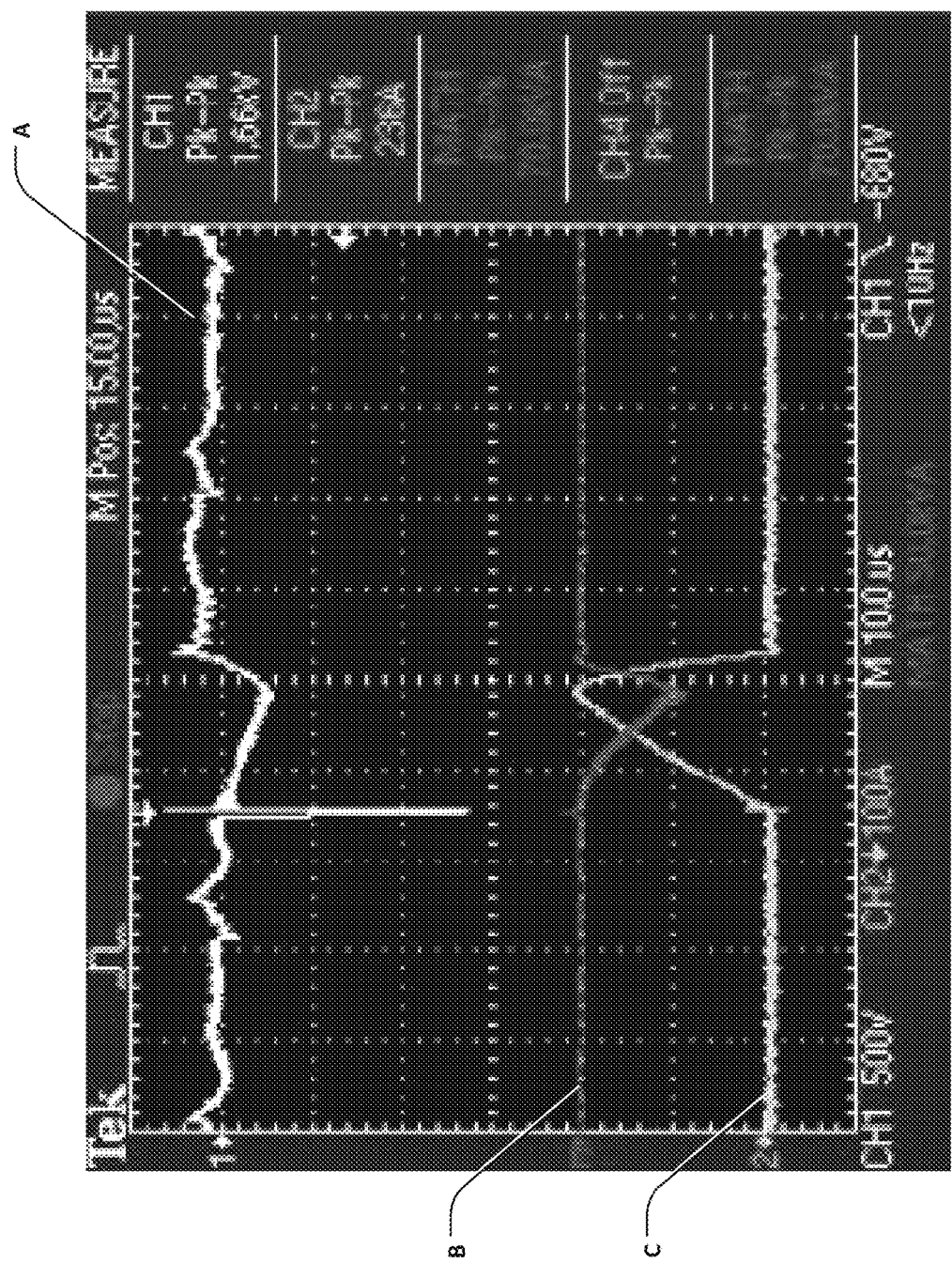
FIG. 4b illustrates a screenshot of oscilloscope traces of voltage, current and power during the operation of an atmospheric pressure pulsed arc plasma source as described herein.

FIG. 4a and FIG. 4b are snap shots of the oscilloscope screen exhibiting voltage (A), current (B) and power (C) traces provided by a DC pulse supplied by the atmospheric pressure pulsed arc plasma source. FIG. 4a illustrates the traces for the stainless steel electrode with the molybdenum nozzle and FIG. 4b illustrates the traces for the copper electrode with the copper nozzle. Relatively high peak current and peak power in the pulse are observed. Other parameters such as the peak voltage, pulse frequency and pulse width are also seen on the oscilloscope readouts.

Figure 5A:
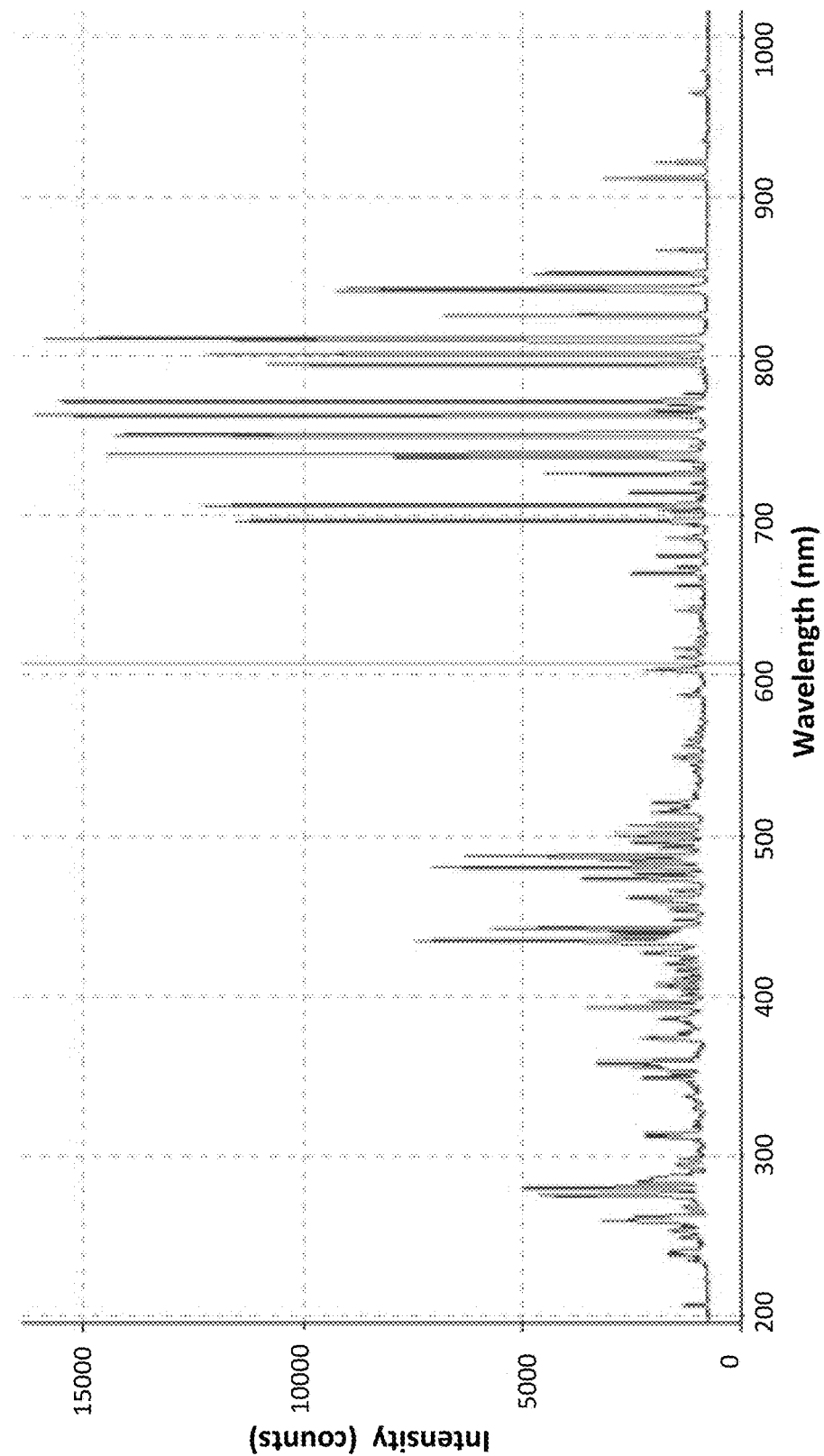
FIG. 5a illustrates an image of an optical emission spectra of stainless steel deposition by the atmospheric pressure pulsed arc plasma source described herein.
Figure 5B:
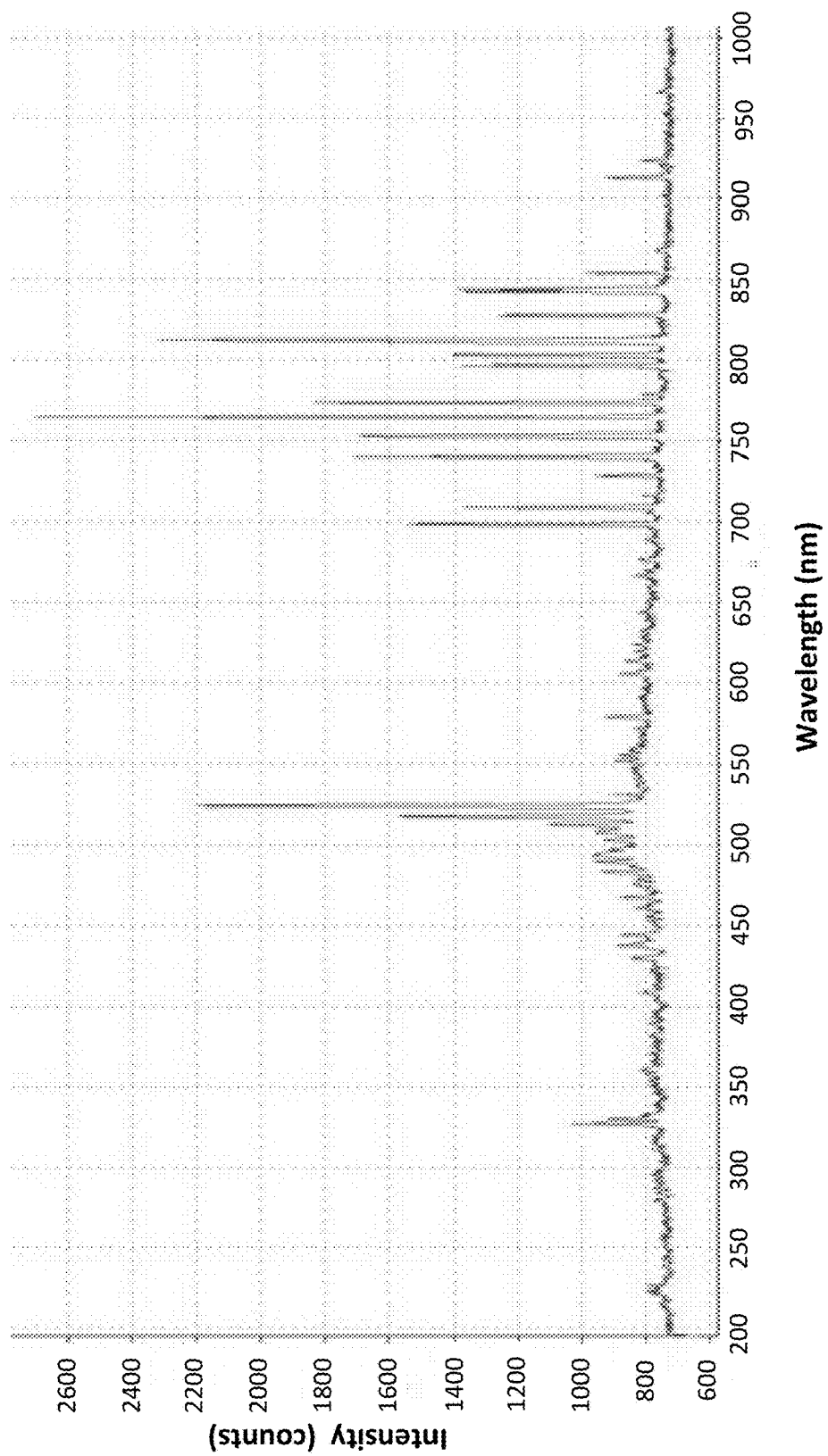
FIG. 5b illustrates an image of an optical emission spectra of copper deposition by the atmospheric pressure pulsed arc plasma source described herein.

Optical emission spectroscopy of the stainless steel and copper plasmas was performed using an Ocean Optics High Resolution HR 4000 Spectrometer from 200 nm to 1000 nm for both samples to identify elements present in each of the plasmas. FIG. 5a illustrates the optical emission spectra for the stainless steel and argon plasma. FIG. 5b illustrates the optical emission spectra for the copper and argon plasma.

Figure 6A:
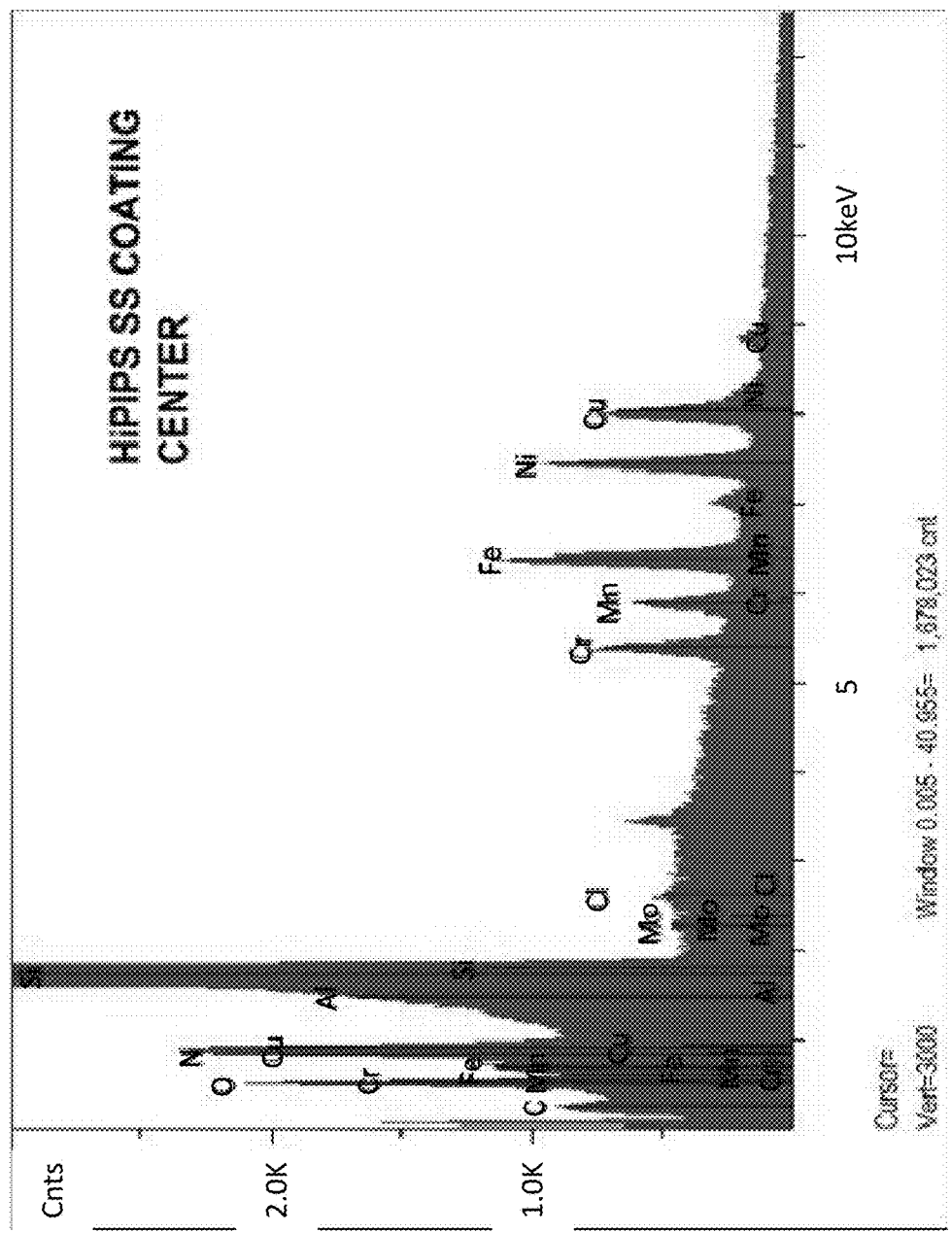
FIG. 6a illustrates an image of an energy dispersive spectra of a stainless steel coating deposited by the atmospheric pressure pulsed arc plasma source described herein.
Figure 6B:
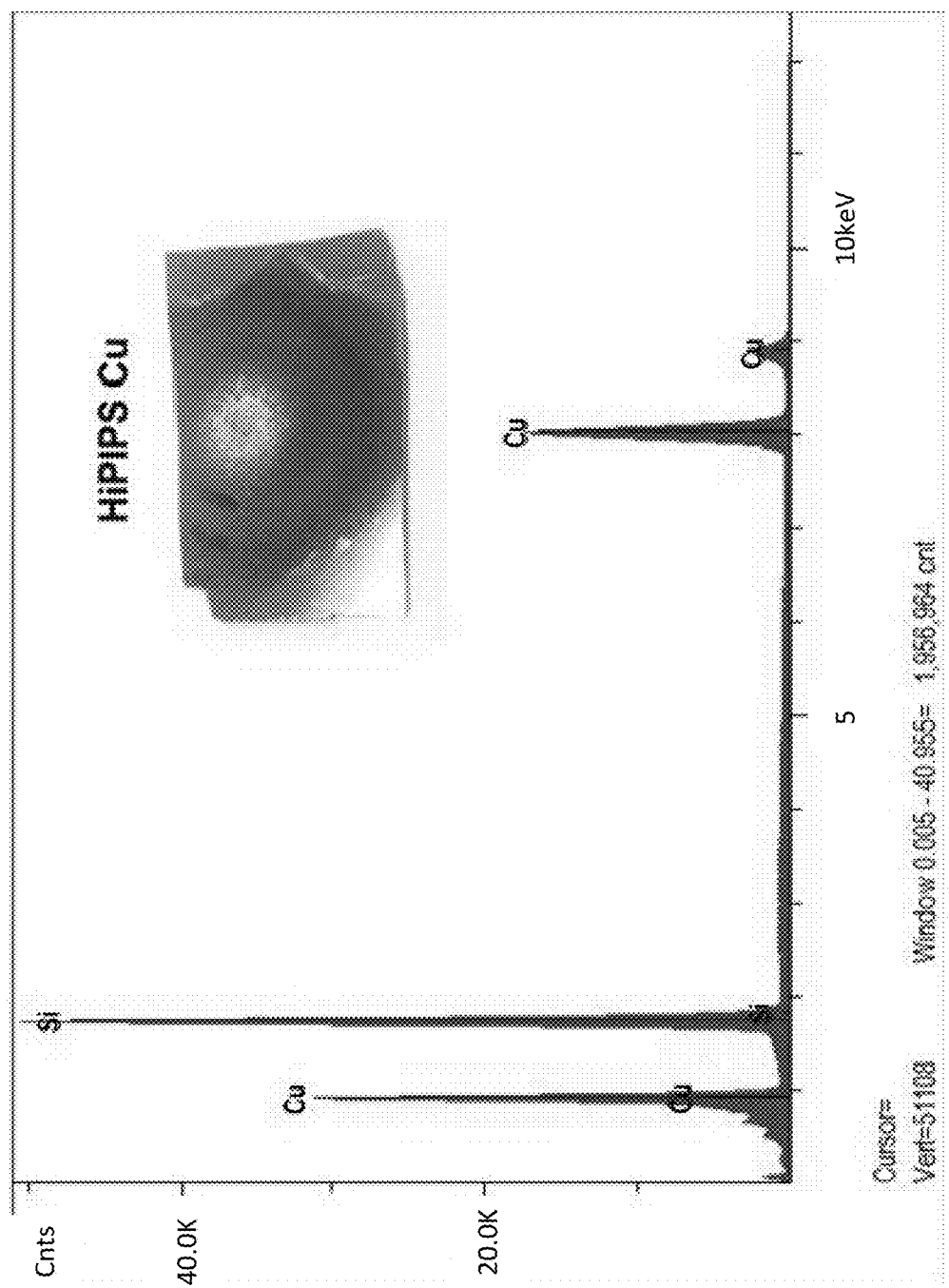
FIG. 6b illustrates an image of an energy dispersive spectra of a copper coating deposited by the atmospheric pressure pulsed arc plasma source described herein.

Energy dispersive spectroscopy was performed for both samples to examine the elemental composition of the coatings. FIG. 6a illustrates the spectra for the stainless steel coating. FIG. 6b illustrates the energy dispersive spectra for the copper coating. The energy dispersive spectra in FIG. 6b shows that the coating included 100% copper.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

The invention claimed is:

1. A method of treating a surface, comprising:
   providing an atmospheric pressure pulsed arc plasma source, including a housing, including at least two pieces and a housing opening therein; an insulator tube having an insulator tube opening therein, wherein said insulator tube is retained within said housing opening; a conductive tube retained within said insulator tube opening, wherein said conductive tube includes a first portion and a second portion; a nozzle retained by said housing pieces and positioned around the first portion of said conductive tube and said insulator tube; a feed path defined by said conductive tube and said nozzle; a gas feed port operatively coupled to said feed path; and a pulsed DC power supply electrically coupled to said conductive tube and said nozzle;
   supplying a gas to said gas feed port from a gas supply;
   feeding a consumable feed stock through said feed path, wherein said consumable feed stock provides an electrode and is electrically coupled to said conductive tube, and wherein said nozzle is formed of a material, wherein said material 1) is the same as said consumable feed stock or 2) comprises a metal or metal alloy;
   supplying a pulsed voltage to said conductive tube from the pulsed DC power supply in the range of 0.5 to 100 kV relative to said nozzle at a pulse frequency in the range of 10 to 5000 Hz and a pulse width of 1 to 5000 µs;
   forming a plasma with said gas in said nozzle;
   emitting a discharge stream from said nozzle onto a substrate, wherein said discharge stream comprises said plasma and exhibits a temperature of less than 50° C. as measured by a thermocouple placed into said discharge stream 1 cm from the nozzle;
   vaporizing said consumable feed stock and said material from said nozzle to form particles of said consumable feed stock and particles of said material from said nozzle, wherein said particles of said consumable feed stock and particles of said material are entrained in said discharge stream; and
   depositing said particles onto said substrate to form a coating.

2. The method of claim 1, wherein said gas is supplied at a pressure of 5 to 700 kPa.

3. The method of claim 1, wherein said pulsed DC power supply supplies a current in the range of 1 to 1,000 A and power in the range of 1 to 1000 kW.

4. The method of claim 1, wherein said gas is selected from Ar, $N_2$, $C_2H_2$, air and combinations thereof.

5. The method of claim 1, wherein said gas includes nitrogen and said consumable feed stock includes a metal, and said coating includes metal nitrides.

6. The method of claim 1, wherein said gas includes carbon and said consumable feed stock includes a metal, and said coating includes metal carbides.

7. The method of claim 1, wherein said gas includes carbon and nitrogen and said consumable feed stock includes a metal, and said coating include a metal carbonitride.

8. The method of claim 1, wherein said gas includes argon and said consumable feed stock is a first material and said nozzle is a second material, and said first and second materials are the same.

9. The method of claim 1, wherein said substrate is a polymeric material.

10. The method of claim 1, wherein said consumable feed stock is electrically coupled to said conductive tube via a conductive wire.

* * * * *